United States Patent [19]
Lavine

[11] Patent Number: 5,302,544
[45] Date of Patent: Apr. 12, 1994

[54] METHOD OF MAKING CCD HAVING A SINGLE LEVEL ELECTRODE OF SINGLE CRYSTALLINE SILICON

[75] Inventor: James P. Lavine, Rochester, N.Y.

[73] Assignee: Eastman Kodak Company, Rochester, N.Y.

[21] Appl. No.: 992,220

[22] Filed: Dec. 17, 1992

[51] Int. Cl.[5] .......................................... H01L 21/339
[52] U.S. Cl. .......................................... 437/53; 437/84; 437/90; 148/DIG. 111
[58] Field of Search .............. 437/49, 50, 53, 83, 437/84, 89, 90, 204; 148/DIG. 152, DIG. 111

[56] References Cited
U.S. PATENT DOCUMENTS

| | | | |
|---|---|---|---|
| 3,853,634 | 12/1974 | Amelio et al. | 437/53 |
| 4,142,925 | 3/1979 | King et al. | 437/84 |
| 4,371,421 | 2/1983 | Fan et al. | 437/89 |
| 4,530,149 | 7/1985 | Jastrzebski et al. | 437/90 |
| 4,549,926 | 10/1985 | Corboy, Jr. et al. | 437/89 |
| 4,566,914 | 1/1986 | Hall | 437/53 |
| 4,586,240 | 5/1986 | Blackstone et al. | 437/89 |
| 4,686,758 | 8/1987 | Liu et al. | 437/89 |
| 4,760,036 | 7/1988 | Schubert | 437/90 |
| 4,952,526 | 8/1990 | Pribat et al. | 437/89 |
| 4,999,314 | 3/1991 | Pribat et al. | 437/89 |

OTHER PUBLICATIONS

J. L. Glenn, Jr. et al., "A fully planar method for creating adjacent 'self-isolating' silicon-on-insulator and epitaxial layers by epitaxial lateral overgrowth", *Applied Physics Letters*, vol. 60(4), Jan. 27, 1992, pp. 483–485.

Primary Examiner—Brian E. Hearn
Assistant Examiner—C. Chaudhari
Attorney, Agent, or Firm—Raymond L. Owens

[57] ABSTRACT

A charge coupled device (CCD) has a single level electrode of single crystalline silicon on an insulating layer over a surface of a body of single crystalline silicon. The CCD is made by forming a layer of insulating material on a surface of a body of single crystalline silicon with a portion of the surface being exposed. A layer of single crystalline silicon is then epitaxially grown by epitaxial lateral overgrowth on the exposed surface of the body and over the insulating material layer. The layer of single crystalline silicon is removed from the surface of the body to insulate the single crystalline silicon layer from the body by the insulating material layer. Portions of the layer of single crystalline silicon are removed to form a plurality of separate gate electrodes.

13 Claims, 2 Drawing Sheets

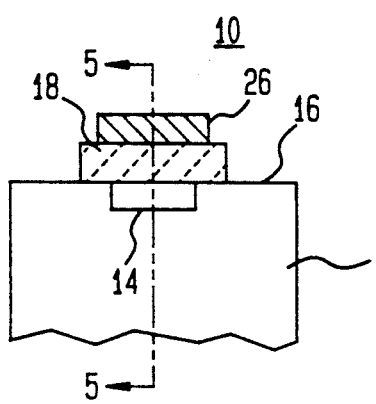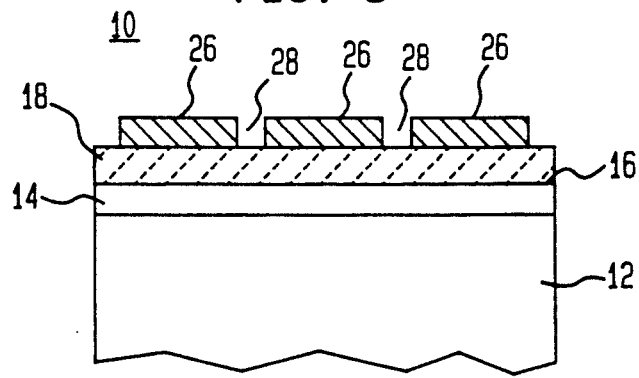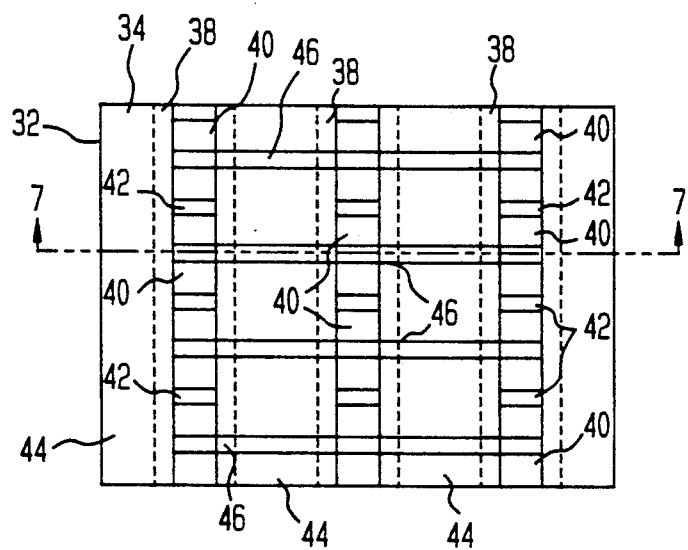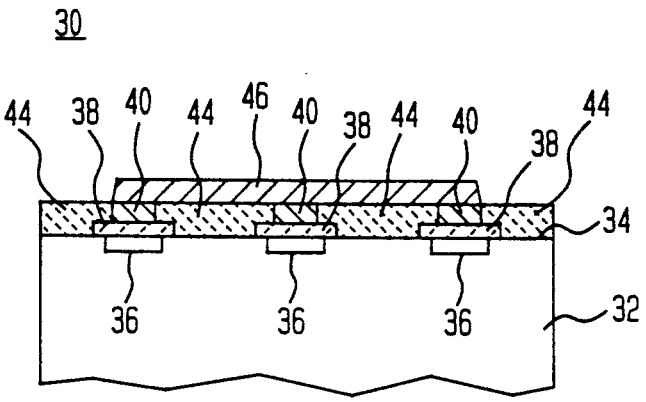

METHOD OF MAKING CCD HAVING A SINGLE LEVEL ELECTRODE OF SINGLE CRYSTALLINE SILICON

FIELD OF THE INVENTION

The present invention relates to a charge coupled device (CCD) having a single level electrode and a method of making the same, and, more particularly, to a CCD with a single level electrode of single crystalline silicon and method of making the same.

BACKGROUND OF THE INVENTION

A CCD, in general, comprises a body of a semiconductor material, such as single crystalline silicon, having a channel region in and along a surface of the body. A layer of an insulating material, typically silicon dioxide, is on the surface of the body and over the channel region. A plurality of conductive gate electrodes, typically of doped polycrystalline silicon, are on the insulating layer and extend across the channel region. The gate electrodes are positioned along the entire length of the channel region.

In a two phase CCD, the gate electrodes are arranged in two sets which alternate along the channel region. The gate electrodes of one set are connected to a first phase potential, and the gate electrodes of the other set are connected to a second phase potential. The gate electrodes are generally made of doped polycrystalline silicon since it is easy to deposit polycrystalline silicon on a layer of insulating material.

The two sets of gate electrodes could be formed from a single layer of the doped polycrystalline silicon by depositing the single layer and defining it by photolithography and etching to form the spaced gate electrodes along the channel region. However, using commercial type photolithographic and etching techniques and equipment, it is difficult to form the polycrystalline silicon gate electrodes having very narrow spacing therebetween with the spacing being uniform across the entire width of the gate electrodes. Since relatively wide and/or non-uniform spacing can form potential barriers between the gate electrodes, they can interfere with the transfer of charge from one gate electrode to the next. Therefore, it has been the practice to form the gate electrodes from two separate levels (layers) of polycrystalline silicon.

For a two level system, a first layer of polycrystalline silicon is deposited and defined to form one set of the gate electrodes. The first set of gate electrodes is covered with a layer of an insulating material, typically silicon dioxide. A second layer of polycrystalline silicon is then deposited over the first set of gate electrodes and the spaces between the first set of gate electrodes. The second layer of polycrystalline silicon is then defined to form the second set of gate electrodes which are between the gate electrodes of the first set. Also, each of the gate electrodes of the second set overlaps the adjacent gate electrodes of the first set. Since the gate electrodes overlap each other, there are no gaps therebetween which can form undesirable potential barriers. However, the two level gate electrode system is relatively complex in structure and requires two deposition steps, two definition steps and an oxidation step. In addition, there is provided an inter-gate capacitance where the gate electrodes of the two sets overlap each other. Therefore, it is desirable to have a CCD having gate electrodes formed from a single level (layer) of a conductive material. Also, it would be desirable to be able to make the gate electrodes of single crystalline silicon since single crystalline silicon can be defined to have very narrow and uniform gaps.

SUMMARY OF THE INVENTION

The present invention is directed to a charge coupled device (CCD) which comprises a body of a semiconductor material of one conductivity type having a surface. A channel region of the opposite conductivity type is in the body and extends to the surface of the body. A layer of an insulating material is on the surface of the body and extends over the channel region. A plurality of single crystalline silicon gate electrodes are on the insulating layer over and spaced along the channel region.

Another aspect of the present invention is directed to a method of making a CCD which comprises forming on a surface of a body of a semiconductor material a layer of an insulating material which exposes at least a portion of the surface of the body. A layer of single crystalline silicon is grown on the exposed portion of the surface of the body and over the insulating material layer. Portions of the epitaxially grown layer of single crystalline silicon are removed so as to form separated individual gate electrodes.

The invention will be better understood from the following more detailed description and claims taken with the accompanying drawing.

BRIEF DESCRIPTION OF THE DRAWINGS

FIG. 4 is a sectional view similar to FIG. 2 showing final steps of the method of making the CCD in accordance with the present invention.

FIG. 5 is a sectional view taken along line 5—5 of FIG. 4.

FIG. 6 is a top plan view of a CCD image sensor made in accordance with the method of the present invention.

FIG. 7 is a sectional view taken along line 7—7 of FIG. 6.

The drawings are not necessarily to scale.

DETAILED DESCRIPTION

Figure 1:
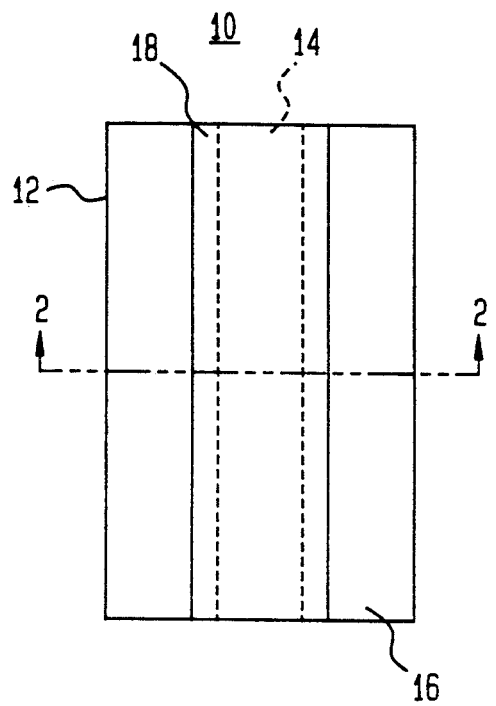
FIG. 1 is a top plan view of a portion of a charge coupled device (CCD) showing an initial step of a method of making the CCD in accordance with the present invention.
Figure 2:
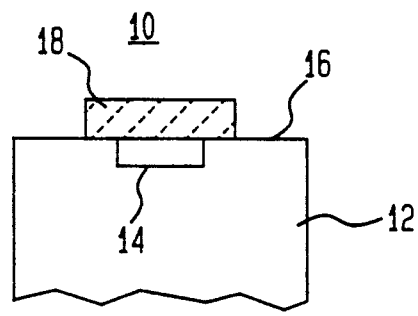
FIG. 2 is a sectional view taken along line 2—2 of FIG. 1.

Referring now to FIGS. 1 and 2, there is shown a top plan view (FIG. 1) and a sectional view (FIG. 2) taken through a dashed line 7—7 of FIG. 1 of a charge coupled device (CCD) 10 in an initial stage of fabrication in accordance with a method of the present invention. CCD 10 comprises a substrate body 12 of a semiconductor material of one conductivity type, such as p-type conductivity single crystalline silicon. The body 12 is provided with a region 14 therein of the opposite conductivity type, such as n-type conductivity, which extends to and along a surface 16 of the body 12. The region 14 forms the buried channel of the CCD 10. The region 14 may be formed by ion implanting an n-type conductivity dopant into the body 12 through the surface 16. On the surface 16 of the body 12 is a layer 18 of an insulating material, typically silicon dioxide. The insulating layer extends over the channel region 14, but does not extend over the entire surface 16 of the body 12. Thus, a portion of the surface 16 is exposed. The insulating layer 18 may be formed by heating the body 12 in an atmosphere containing oxygen. Then, using photolithography and etching, portions of the insulating layer 18 are removed to expose portions of the surface 16 of the body 12.

Figure 3:
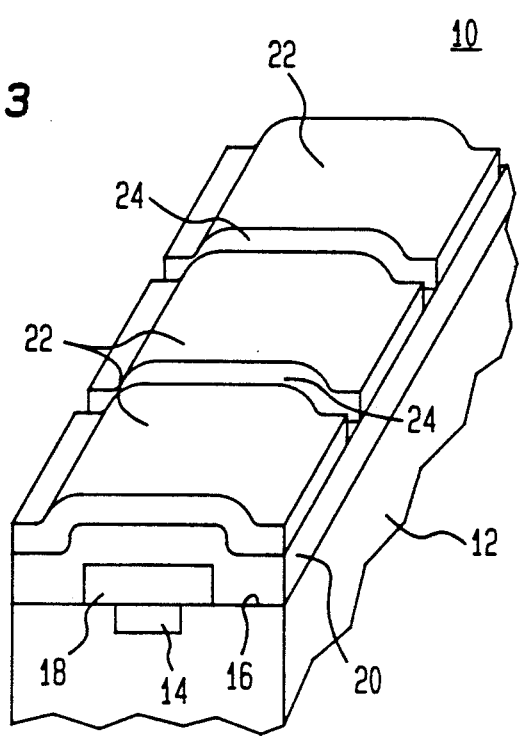
FIG. 3 is a perspective view showing the subsequent steps of the method of making the CCD in accordance with the present invention.

Referring now to FIG. 3, there is shown a perspective view of the CCD 10 in a next stage of fabrication in accordance with the method of the present invention. A layer 20 of single crystalline silicon is formed over the exposed portions of the surface 16 of the body 12 and the insulating layer 18. The single crystalline silicon layer 20 is formed by epitaxially growing the silicon on the exposed portions of the surface 16 of the body 12 and then laterally over the insulating layer 18. This can be achieved by known technique of "epitaxial lateral overgrowth" as described in U.S. Pat. No. 4,530,149 (Jastrzebski et al.), issued Jul. 23, 1985, and entitled "Method For Fabricating A Self-Aligned Vertical IGFET", U.S. Pat. No. 4,586,240 (Blackstone et al.), issued May 6, 1986 and entitled "Vertical IGFET With Internal Gate And Method For Making Same", and the article of J. L. Glenn, Jr. et al., entitled "A fully planar method for creating adjacent 'self-isolating' silicon-on-insulator and epitaxial layers by epitaxial lateral overgrowth", published in *Applied Physics Letters*, Vol 60, No 4, Jan. 27, 1992, pages 483–485. The single crystalline silicon layer 20 is then doped, preferably n+ type conductivity, to make it conductive. This can be achieved by either ion implantation or diffusion. A masking layer 22 of a photoresist is on a portion of the single crystalline silicon layer 20 which is over the insulating layer 18 and extends along the channel region 14. The masking layer 22 has narrow gaps 24 therein spaced long the masking layer 22 so that the masking layer 22 is divided into a plurality sections of uniform length along the channel region 14. The masking layer 22 may be formed by applying it over the entire single crystalline silicon layer 20 and then defining the masking layer 22 (i.e., removing portions thereof) using photolithographic techniques.

Referring now to FIGS. 4 and 5, there are shown sectional views of the CCD 10 in a next stage of fabrication in accordance with the method of the present invention. The portion of the single crystalline silicon layer 20 which is not covered by the masking layer 22 is then removed with a suitable etchant. The portions of the single crystalline silicon layer 20 which are in contact with the body 12 are also removed, such as by etching, to electrically isolate the single crystalline silicon layer 20 from the body 12. As shown in FIG. 5, this forms a plurality of gate electrodes 26 which are spaced along the channel region 14 and have narrow gaps 28 (no greater than about ¼ micron) therebetween. A layer of single crystalline silicon can be etched more cleanly than a layer of polycrystalline silicon so that narrow gaps 28 of uniform width can be formed in the single crystalline silicon layer 20. The masking layer 22 is removed with a suitable solvent and the CCD 10 is then completed in the usual manner.

Referring now to FIGS. 6 and 7, there are shown a top plan view (FIG. 6) and sectional view (FIG. 7) taken through a dashed line 7—7 of FIG. 6 of a charge coupled device (CCD) image sensor array 30 in accordance with the present invention. Image sensor array 30 comprises a substrate body 32 of a semiconductor material of one conductivity type, such as p-type conductivity single crystalline silicon, having a surface 34. In the body 32 are a plurality of spaced apart, parallel channel regions 36 which extend to the surface 34. The channel regions 36 are of n-type conductivity. On the surface 34 are a plurality of strips 38 of an insulating material, typically silicon dioxide. Each of the insulating strips 38 extends over and along a separate one of the channel regions 36. On each of the insulating strips 38 is a layer 40 of doped single crystalline silicon which has been patterned and etched to provide gaps 42 therethrough spaced along the layer with the gaps 42 dividing the layer into a plurality of gate electrodes 40. The gate electrodes 40 are of the same size so that the gate electrodes 40 are arranged in an array of columns along each channel region 36 and rows across the channel regions 36. The spaces between the insulating strips 38 and the gate electrodes 40 are filled with an insulating material 44, such as silicon dioxide, which extends to the surface of the gate electrodes 40. A separate strip 46 of a conductive material, such as a metal, extends between and electrically connects the gate electrodes 40 in each row.

The image sensor array 30 is made in the same manner as the CCD 10 described above except that the epitaxially grown single crystalline silicon layer is defined into a plurality of strips which extend over the insulating strips 38. Also, after the single crystalline silicon strips 40 are formed, the insulating material 44 is deposited in the spaces between the insulating strips 38 and the silicon strips 40. Finally, a layer of a conductive material is deposited over the silicon strips 40 and the insulating material 44 and is defined, using photolithographic techniques and etching, to form the conductive strips 46 which electrically connect the gate electrodes 40 in each row.

Thus, there is provided by the present invention a CCD and a CCD image sensor array in which the gate electrodes of each CCD is formed of a single layer of single crystalline silicon. The gate electrodes are formed by epitaxially growing a layer of single crystalline silicon using epitaxial lateral overgrowth over a layer of insulating material. The epitaxial layer of single crystalline silicon is then defined to form the gate electrodes having narrow gaps therebetween. The single crystalline silicon can be easily etched with narrow gaps of uniform width using standard etching techniques to provide the gate electrodes which are closely spaced to each other.

It is to be appreciated and understood that the specific embodiments of the invention are merely illustrative of the general principles of the invention. Various modifications may be made consistent with the principles set forth. For example, the single crystalline silicon layer 20 can be electrically isolated from the body 12 by methods other than etching. The portions of the single crystalline silicon layer 20 which are in contact with the body 12 can be converted to an insulating material, such as by oxidation or ion-implantation of a suitable dopant, such as oxygen. Also, the single crystalline silicon layer 20 can be electrically isolated from the body 12 either before or after it is etched to form the individual gate electrodes 26. In the array 30 shown in FIGS. 6 and 7, the insulating material layer 44 which is between the insulating strips 38 and the gate electrodes 40 can be formed by methods other than depositing an insulating layer. For example, portions of the single crystalline silicon layer from which the gate electrodes 40 are formed can be converted to an insulating material, such as by oxidation or ion-implantation of a suitable dopant, to define the gate electrodes 40 with insulating material therebetween.

What is claimed is:

1. A method of making a CCD comprising the steps of:
   forming a channel region in a body of a semiconductor material that extends to a surface of the body;
   forming a layer of an insulating material on the surface of the body over the channel region which exposes at least a portion of the surface of the body;
   growing a layer of single crystalline silicon on the exposed surface of the body over the insulating layer; and
   removing portions of the epitaxially grown layer of single crystalline silicon so as to form separated gate electrodes located over the channel region.

2. The method of claim 1 in which the single crystalline silicon layer is grown by epitaxial lateral overgrowth from the exposed surface of the body over the insulating layer.

3. The method of claim 2 in which the body is of single crystalline silicon.

4. The method of claim 3 further comprising the step of electrically isolating the single crystalline silicon layer from the exposed surface of the body.

5. The method of claim 4 in which the single crystalline silicon layer is electrically isolated from the body by the step of removing the single crystalline silicon layer from the exposed surface of the body so as to insulate the single crystalline silicon layer from the body by the insulating layer.

6. The method of claim 4 in which the single crystalline silicon layer is electrically isolated from the body by the step of converting the portions of the single crystalline silicon layer which are in contact with the exposed surface of the body to an insulating material.

7. A method of making a CCD array comprising the steps of:
   forming in a body of a semiconductor material a plurality of CCD channel regions which extend to a surface of the body and which are in spaced apart parallel relation;
   forming an insulating layer on the surface of the body which extends over all of the channel regions and exposes portions of the surface of the body adjacent the channel regions;
   growing a layer of single crystalline silicon on the exposed portions of the surface of the body and on the insulating layer over all of the channel regions;
   removing portions of the single crystalline silicon layer so as to form separated gate electrodes which extend in columns along the channel regions and in rows across the channel regions; and
   electrically connecting the gate electrodes which extend in each row of the gate electrodes.

8. The method of claim 7 in which the single crystalline silicon layer is grown by epitaxial lateral overgrowth from the exposed portions of the surface of the body on the insulating layer.

9. The method of claim 8 in which the body is of single crystalline silicon and further comprising the step of electrically isolating the single crystalline silicon layer from the exposed portions of the surface of the body.

10. The method of claim 8 in which the single crystalline silicon layer is electrically isolated from the body by the step of removing the portions of the single crystalline silicon film which are in contact with the body.

11. The method of claim 8 in which the single crystalline silicon layer is electrically isolated from the body by the step of converting to an insulating material the portions of the single crystalline silicon layer which are in contact with the body.

12. The method of claim 9 further comprising the step of filling the spaces between the columns of gate electrodes with an insulating material.

13. The method of claim 12 further comprising the step of forming strips of a conductive material between the gate electrodes of each row and over the insulating material between the columns of gate electrodes so as to electrically connect the rows of gate electrodes.

* * * * *